United States Patent
Tsui et al.

(10) Patent No.: US 12,256,559 B2
(45) Date of Patent: Mar. 18, 2025

(54) SOURCE-BODY SELF-ALIGNED METHOD OF A VERTICAL DOUBLE DIFFUSED METAL OXIDE SEMICONDUCTOR FIELD EFFECT TRANSISTOR

(71) Applicant: National Yang Ming Chiao Tung University, Hsinchu (TW)

(72) Inventors: Bing-Yue Tsui, Hsinchu (TW); Jui-Cheng Wang, Hsinchu (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 486 days.

(21) Appl. No.: 17/878,443

(22) Filed: Aug. 1, 2022

(65) Prior Publication Data

US 2023/0361195 A1    Nov. 9, 2023

(30) Foreign Application Priority Data

May 6, 2022   (TW) ................................. 111117127

(51) Int. Cl.
*H01L 29/66* (2006.01)
*H01L 21/04* (2006.01)
(Continued)

(52) U.S. Cl.
CPC ....... *H10D 12/031* (2025.01); *H01L 21/0465* (2013.01); *H10D 30/66* (2025.01);
(Continued)

(58) Field of Classification Search
None
See application file for complete search history.

(56) References Cited

U.S. PATENT DOCUMENTS 8,476,697 B1    7/2013   Cooper et al.
2005/0181536 A1*   8/2005   Tsuji ................... H10D 62/405
                                            257/E29.081
(Continued)

OTHER PUBLICATIONS

Ge et al., "A Channel Self-Alignment process for High-Voltage VDMOSFETs in 4H-SiC," Journal of Physics: Conference Series, 2021, vol. 2083, pp. 1-6.
(Continued)

*Primary Examiner* — Asok K Sarkar
(74) *Attorney, Agent, or Firm* — Birch, Stewart, Kolasch & Birch, LLP

(57) ABSTRACT

A source-body self-aligned method of a VDMOSFET is provided. A pad layer and an unoxidized material layer are sequentially formed on an epitaxial layer on a semiconductor substrate. A lithography process is then carried out for patterning. Later, a thermal oxidation process is employed such that the unoxidized material layer is oxidized to form oxidation layers. Then, a source ion implantation process is performed, and a wet etching is used to remove the oxidation layers before successively employing a body ion implantation process. By using the process method disclosed in the present invention, it achieves to form the source region and the body region which are self-aligned. Meanwhile, since process complexity of the invention is relatively low, process uniformity and process cost can be optimally controlled. In addition, the invention achieves to reduce channel length and on-resistance, thereby enhancing the reliability effectively.

16 Claims, 15 Drawing Sheets

(51) Int. Cl.
*H10D 12/01* (2025.01)
*H10D 30/66* (2025.01)
*H10D 62/13* (2025.01)
*H10D 62/17* (2025.01)
*H10D 62/832* (2025.01)
*H01L 21/02* (2006.01)
*H10D 62/80* (2025.01)
*H10D 62/83* (2025.01)
*H10D 62/85* (2025.01)

(52) U.S. Cl.
CPC ......... *H10D 62/151* (2025.01); *H10D 62/393* (2025.01); *H10D 62/8325* (2025.01); *H01L 21/02126* (2013.01); *H01L 21/02164* (2013.01); *H01L 21/02236* (2013.01); *H01L 21/02238* (2013.01); *H10D 62/80* (2025.01); *H10D 62/8303* (2025.01); *H10D 62/8503* (2025.01)

(56) References Cited

U.S. PATENT DOCUMENTS

2006/0220061 A1* 10/2006 Shimoida .......... H10D 62/8325
257/E29.252
2008/0121993 A1* 5/2008 Hefner .................... H10D 8/00
257/E29.256
2008/0135954 A1* 6/2008 Ohmi .................... H10D 30/66
257/E21.294
2009/0090910 A1* 4/2009 Moriwaki ............. H10D 86/60
438/667
2012/0018743 A1* 1/2012 Hiyoshi ................. H10D 30/66
257/77
2014/0145211 A1* 5/2014 Chakrabarti .......... H01L 21/045
257/77
2014/0167073 A1* 6/2014 MacMillan ....... H01L 29/66068
257/77

OTHER PUBLICATIONS

Huang et al., "Design and fabrication of a 3.3 kV 4H-SiC MOSFET," Journal of Semiconductors, Sep. 2015, vol. 36, No. 8, total 4 pages.
Matin et al., "A Self-Aligned Process for High-Voltage, Short-Channel Vertical DMOSFETs in 4H-SiC," IEEE Transactions on Electron Devices, Oct. 2004, vol. 51, No. 10, pp. 1721-1725.
Morikawa et al., "Device Design Consideration for Robust SiC VDMOSFET With Self-Aligned Channels Formed by Tilted Implantation", IEEE Transactions on Electron Devices, Aug. 2019, vol. 66, No. 8, pp. 3447-3452.

* cited by examiner

SOURCE-BODY SELF-ALIGNED METHOD OF A VERTICAL DOUBLE DIFFUSED METAL OXIDE SEMICONDUCTOR FIELD EFFECT TRANSISTOR

This application claims priority of Application No. 111117127 filed in Taiwan on 6 May 2022 under 35 U.S.C. § 119; the entire contents of all of which are hereby incorporated by reference.

BACKGROUND OF THE INVENTION

Field of the Invention

The present invention is related to a self-aligned method. More particularly, it is related to a source-body self-aligned method of a Vertical Double Diffused Metal Oxide Semiconductor Field Effect Transistor (VDMOSFET).

Description of the Prior Art

In general, power devices have been widely used in various power electronics fields, including: switching elements, motor control, consumer electronics, uninterruptible power systems and so on, due to features of low power consumption, high voltage endurance, rapid switching speed, and safe operating range. Practically, in order to tolerate the high voltages in circuit applications, a drift region with low doping concentration is usually formed at a drain terminal of a common power device. As known, the specific on-resistance ($R_{on,\,sp}$) of the drift region and breakdown voltage $V_B$ of the device can be expressed by the following equation (1). As we can see, when the breakdown voltage $V_B$ is getting higher, the specific on-resistance $R_{on,\,sp}$ will also increase significantly. Therefore, the power loss of the power device when running in operation will increase accordingly.

$$R_{on,sp}=8.3\times10^{-9}\lambda V_B^{2.5}\ \Omega\cdot cm^2 \qquad (1)$$

Assume that the power device uses a Lateral Diffused Metal Oxide Semiconductor Field Effect Transistor (LD-MOSFET), in which its drift region extends laterally, under such the circumstance, it is believed that the cell pitch of the device also increases greatly in addition to the above-mentioned increasing on-resistance problem. Therefore, considering in a same process area for fabricating devices, it only obtains a fewer number of devices. And from the angle of the current technology developments eager for device miniaturization trends, it is apparent that such the above-mentioned process technique is definitely not favorable.

For solving these deficiencies, Vertical Double Diffused Metal Oxide Semiconductor Field Effect Transistors (VD-MOSFETs) have been proposed in the prior arts. Since the drift region of a VDMOSFET extends vertically, the cell pitch of the device it is applied to does not increase and thus is beneficial to device miniaturization. At the same time, since the manufacturing process of a VDMOSFET is relatively simple, and resulting in less reliability problems, the VDMOSFETs have gradually become the commonly used device structures in the current high-power semiconductor applications.

However, regarding an ion implantation process in silicon carbide (SiC) VDMOSFET process, it usually requires a high annealing temperature up to 1600° C. to reduce defects and activate impurities. Since this temperature is higher than the melting temperature of polysilicon (Poly-Si), its related gate processes can only be performed after all the ion implantation processes are complete and annealed. In such a condition, a source region and a body region of the device after implantations are very difficult to be self-aligned, and such misalignment leads to asymmetry of the currents in left and right channels. Due to such current asymmetry problem, it is believed that a shorter channel length results in worse reliability. For avoiding such misalignment causing a shorter channel length, a longer channel length is to be expected. However, the longer channel length increases the channel resistance on the other hand. Also, an increased cell pitch increases the on-resistance as well. As we can see, such conventional methodology leads to a series of negative effects. As a result, it is apparent that for the existing VDMOSFETs, it is certainly necessary to develop a new process for controlling its source region and body region to be self-aligned and improve its efficacy.

Therefore, on account of above, to overcome the above-mentioned issues, it should be apparent that there is indeed an urgent need for the professionals in the field for a new and novel process method to be developed, that can effectively solve the foregoing problems existing in the prior arts. By employing the proposed process method, a source region and body region of the transistor should be self-aligned, without increasing its channel length. Regarding the detailed specific descriptions and implementations, Applicants of the present invention will be providing in details in the following paragraphs as below.

SUMMARY OF THE INVENTION

In order to overcome the above-mentioned disadvantages, one major objective in accordance with the present invention is provided for a novel process technology, which is applicable to a Vertical Double Diffused Metal Oxide Semiconductor Field Effect Transistor (VDMOSFET), or further widely applied to any power transistor which includes the VDMOSFET structure, for example, an Insulated Gate Bipolar Transistor (IGBT), such that a source region and a body region of the transistor structure are controlled to be self-aligned.

According to the disclosed process technology of the present invention, it requires only a simple thermal oxidation process along with an etching process. Therefore, the process complexity of the present invention is relatively low. In addition, the self-alignment of the source region and body region of the VDMOSFET structure is successfully achieved without considering any misalignment. A channel length can be reduced to less than 0.5 μm, which complies with the device miniaturization requirements in the current semiconductor industries.

According to the process technology disclosed in the present invention, a plurality of parameters such as the temperature and time for performing the thermal oxidation process can be adjusted. The present invention is characterized by having superior process flexibilities.

According to the novel process techniques provided by Applicants of the present invention, it is aimed to disclose a source-body self-aligned method, which comprises a plurality of following steps:

(a): providing a semiconductor substrate and forming an epitaxial layer on the semiconductor substrate.

(b): sequentially providing a pad layer and an unoxidized material layer on the epitaxial layer. According to one embodiment of the present invention, the pad layer can be a single-layer structure, made of silicon dioxide ($SiO_2$) or silicon nitride (SiN). According to other embodiment of the present invention, the pad layer can also be a stacked-layer structure, consisting of silicon dioxide ($SiO_2$) and silicon nitride (SiN). A thickness of the pad layer is for example, between 10 nm and 100 nm.

In another aspect, regarding the unoxidized material layer, it can be made of for example, a polysilicon (Poly-Si) or an amorphous silicon carbide (SiC). A thickness of the unoxidized material layer is for example, between 0.5 μm and 3 μm.

(c): patterning the unoxidized material layer to form at least one first barrier mask and a second barrier mask. A first gap is formed between the first barrier mask and the second barrier mask. According to one embodiment of the present invention, such patterning step can be performed, for instance through a lithography process, so as to make the unoxidized material layer form into specific block shapes.

(d): performing a thermal oxidation process such that the unoxidized material layer is oxidized to form a first oxidation layer and a second oxidation layer. The first barrier mask is coated with the first oxidation layer and the second barrier mask is coated with the second oxidation layer. A second gap is formed between the first oxidation layer and the second oxidation layer, and the second gap is less than the above-mentioned first gap.

As for the thermal oxidation process performed therein, a process temperature of the thermal oxidation process can be set for example, between 800 and 1100 Celsius degrees. And a process time of the thermal oxidation process is between 0.5 and 12 hours. A thickness of the first oxidation layer and the second oxidation layer to be formed is for example, between 0.2 μm and 1.0 μm. Among all, for those who are skilled in the art and having ordinary knowledge, appropriate modifications or changes based on the technical contents disclosed in the present invention without departing from the spirit of the present invention are practicable. However, the modifications should still fall into the scope of the present invention. The present invention is certainly not limited thereto the disclosed parameters, conditions, as well as fields of the application. The present invention has wide process flexibilities.

(e): performing a source ion implantation process, such that a first heavily doped region and a second heavily doped region are formed in the foregoing epitaxial layer. The first heavily doped region and the second heavily doped region are respectively configured on opposite sides of the first barrier mask. And, either the first heavily doped region or the second heavily doped region is self-aligned with the above-mentioned second gap.

(f): removing the first oxidation layer, the second oxidation layer, and optionally the pad layer under the first and second oxidation layers, such that a plurality of implantation gap is exposed between the first heavily doped region, the second heavily doped region, the first barrier mask and the second barrier mask.

(g): performing a body ion implantation process, such that a first body region and a second body region are formed in the foregoing epitaxial layer. Meanwhile, the first body region and the second body region fill the plurality of implantation gap. And, the above-mentioned first heavily doped region and second heavily doped region are respectively configured in the first body region and the second body region. The first body region and the second body region are respectively self-aligned with the first heavily doped region and the second heavily doped region.

According to the disclosed technical contents of the present invention, the first body region and the second body region are aligned with a peripheral border of the first barrier mask and the second barrier mask. Meanwhile, either the first body region or the second body region is accurately aligned with the foregoing first gap. By employing the technical solution of the present invention, it achieves in successfully and accurately control the self-alignment of the source region and the body region. In addition, only a tiny portion of the unoxidized material layer (Poly-Si) is consumed. Compared to the prior arts, it is apparent that the process uniformity and process cost of the present invention are in better control, and thus provide the present invention with excellent process efficiency.

Furthermore, according to the process technology disclosed in the present invention, the above-mentioned semiconductor substrate, the epitaxial layer, the first heavily doped region and the second heavily doped region have a first semiconductor type. And, the first body region and the second body region have a second semiconductor type. The first semiconductor type and the second semiconductor type are opposite conductivity types. In other words, the present invention is not limited to an N-type or P-type conductivity type. According to the disclosed self-aligned method proposed in the present invention, it is applicable to achieve the self-alignment of an N-type source region and a P-type body region. In the same manner, it is also applicable to achieve the self-alignment of a P-type source region and an N-type body region. In the following, regarding the embodiments of the present invention disclosed by the Applicants, an N-type silicon carbide is simply used as an illustrative example to implement the semiconductor substrate of the present invention for introducing the technical spirits of the invention. As a result, it is aimed to enable those skilled in the art to fully understand the technical solution of the present invention, and yet not to limit the application of the present invention. In other words, according to the process method disclosed in the present invention, its application field is certainly not limited to the N-type silicon carbide substrate, but can also be widely applied to a variety of semiconductor substrates, including transistors with an N-type channel or a P-type channel. Also, substrates made of semiconductor materials having a wide bandgap, such as gallium oxide ($Ga_2O_3$), aluminum nitride (AlN), and diamond, etc. are applicable as well. Apart from these, according to the source-body self-aligned method disclosed in the present invention, it is obvious that the process method can be applied to a Vertical Double Diffused Metal Oxide Semiconductor Field Effect Transistor (VDMOSFET). Alternatively, it can be further widely applied to any power transistor which includes the VDMOSFET structure, for example, an Insulated Gate Bipolar Transistor (IGBT). Overall, for people who are skilled in the art and having ordinary knowledge, appropriate modifications or changes based on the technical solutions disclosed in the present invention without departing from the spirit of the present invention are practicable. However, the modifications should still fall into the scope of the present invention. The present invention is certainly not limited thereto the disclosed parameters, conditions, as well as fields of the application.

And yet, moreover, as in the previous (f) step, wherein the first oxidation layer, the second oxidation layer, and the pad layer under the first and second oxidation layers are removed, a wet etching process can be employed to perform the removing step. According to the technical contents of the present invention, when a wet etching process is used to remove the first and second oxidation layers ($SiO_2$) so the Poly-Si remains, it accordingly controls the surface damage of the channel region effectively, minimizes the damage and improves the surface roughness. Meanwhile, the mobility of the channel carriers is improved accordingly, thereby increase the channel current, and reduce the on-resistance effectively. On account of these, it is evident that some other substantial inventive effects of the present invention are well accomplished.

Based on the above, after the source region and body region are self-aligned by adopting the proposed process method of the present invention, a plurality of post end processes can be further performed, including:

(h): removing the remaining pad layer and unoxidized material layer, and forming a third heavily doped region in the first body region or in the second body region. Furthermore, a floating guard ring implantation process can be carried out to further fabricate at least one floating guard ring in the epitaxial layer as a termination protection structure.

(i): successively growing a field oxide layer on the epitaxial layer.

(j): applying a lithography process to the field oxide layer to define a gate region.

(k): forming a gate oxide layer in the gate region.

(l): forming a gate conductive layer on the gate oxide layer. In specific, according to one embodiment of the present invention, regarding forming the gate conductive layer, it is feasible to use a low-pressure chemical vapor deposition (LPCVD) process to deposit polysilicon as a gate material first. After that, an etch back process is employed to etch back the polysilicon, such that the gate conductive layer is formed. And after that, a dielectric layer can be further deposited on the gate conductive layer.

(m): forming at least one contact window which extends through the dielectric layer, and electrically connected to the first heavily doped region, the second heavily doped region and the third heavily doped region for providing electrical paths.

Therefore, to sum up, it is apparent that the present invention discloses a novel process method for achieving source-body self-alignment of a VDMOSFET structure. In view of the disclosed process method, it merely requires to deposit the Poly-Si first, and a lithography process is performed to define the Poly-Si pattern. After that, a thermal oxidation process is then carried out such that the Poly-Si expands its boundary. Subsequently, source ions are implanted, and a wet etching process is used to remove the oxidation layers (silicon dioxide) such that the Poly-Si is left. Finally, a body ion implantation process is performed, and the source region and body region which are self-aligned are accomplished by employing the present invention.

Below, the embodiments are described in detail in cooperation with the drawings, so that these and other objectives of the present invention will become obvious to those of ordinary skill in the art after reading the following detailed description of preferred embodiments. And technical contents, characteristics and accomplishments of the invention are easily comprehensible.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
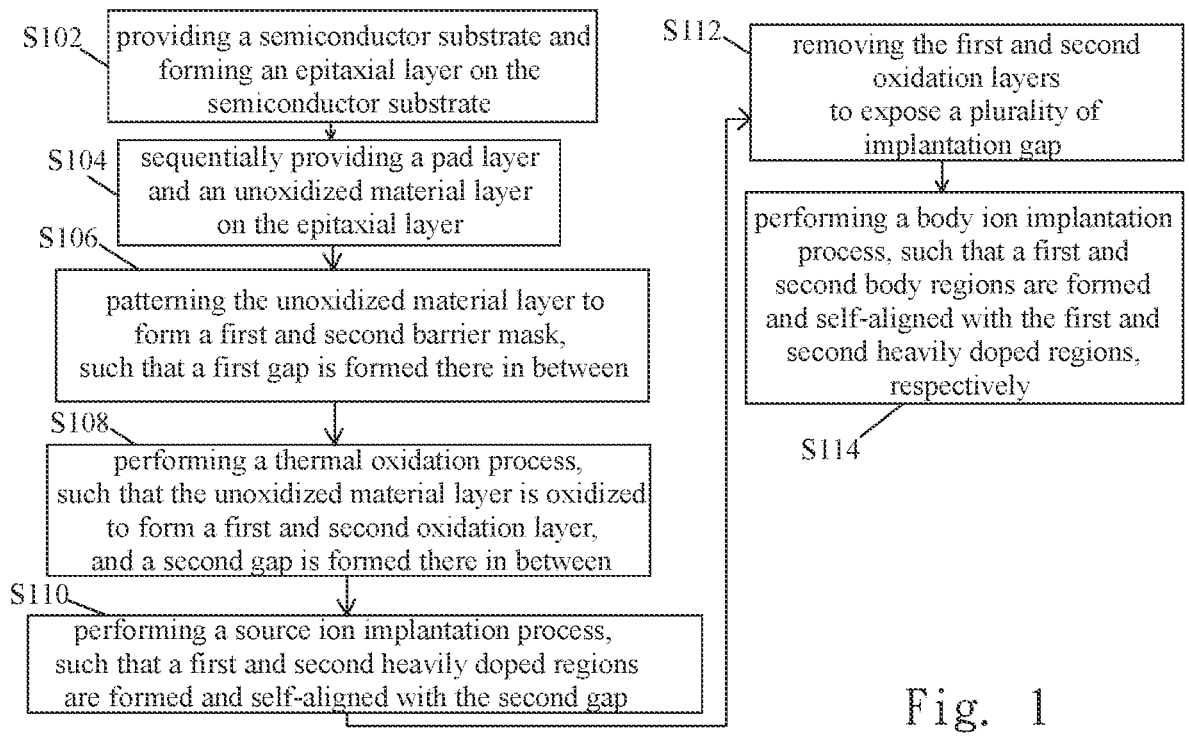
FIG. 1 shows a process flow chart illustrating the steps of the proposed source-body self-aligned method of a vertical double diffused metal oxide semiconductor field effect transistor (VDMOSFET) in accordance with the embodiment of the present invention.

It is to be understood that both the foregoing general description and the following detailed description are exemplary and are intended to provide further explanation of the invention as claimed.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

The present invention discloses a source-body self-aligned method which is applicable to a Vertical Double Diffused Metal Oxide Semiconductor Field Effect Transistor (VDMOSFET), or to any power transistor which includes the VDMOSFET structure, for example, an Insulated Gate Bipolar Transistor (IGBT), such that the source region and the body region of the VDMOSFET structure are fabricated to be self-aligned. In the following descriptions, a basic VDMOSFET structure will be provided as an illustrative embodiment for explaining the technical features of the present invention.

Please refer to FIG. 1, which discloses a process flow chart illustrating the steps of the proposed source-body self-aligned method in accordance with the embodiment of the present invention. The proposed source-body self-aligned method includes step S102, step S104, step 106, step 108, step 110, step 112 and step 114. FIG. 2 to FIG. 15 are accompanying drawings, which show schematic cross-sectional views of the structure of a VDMOSFET by employing the proposed source-body self-aligned method disclosed in the present invention. For the following descriptions, please refer to these figures at the same time.

Figure 2:
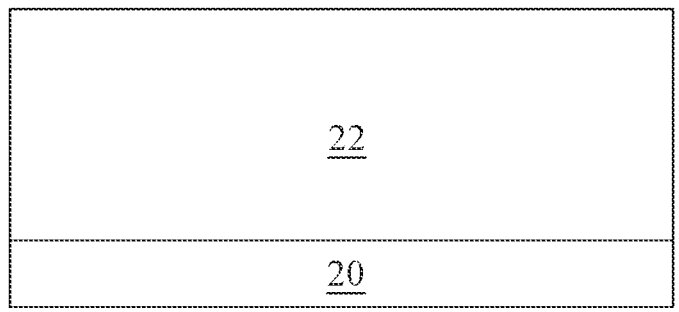
FIG. 2 shows a schematic structural diagram of forming an epitaxial layer on a semiconductor substrate in accordance with one embodiment of the present invention.

As can be seen from FIG. 2, a semiconductor substrate 20 is provided first. And an epitaxial layer 22 is formed on the semiconductor substrate 20 (step S102). In such step, according to one preferred embodiment of the present invention, the semiconductor substrate 20 preferably, can be made of an N-type silicon carbide (SiC) material. And, an N-type SiC epitaxial layer (N-epi) with a doping concentration of $1\times10^{16}$ cm$^{-3}$ and a thickness of 5.5 μm is grown on the front side of the semiconductor substrate 20 by epitaxial growth, so as to form the structure as shown in FIG. 2. Hereinafter, it is worth noting that the material for fabricating the semiconductor substrate 20 is not limited to N-type silicon carbide. In alternative embodiments of the present invention, alternative semiconductor materials, having the wide bandgap such as: gallium oxide ($Ga_2O_3$), aluminum nitride (AlN), and diamond, are also feasible for fabricating the semiconductor substrate 20 of the present invention. In the following descriptions, the Applicants merely take the substrate made of N-type silicon carbide as an illustrative example for introducing the technical features of the present invention. In the same manners, those skilled in the art are acknowledged to apply the disclosed method in the present invention to the transistor having a P-type semiconductor substrate on account of teachings from the present invention. Similar descriptions are thus omitted in the present invention.

Figure 3:
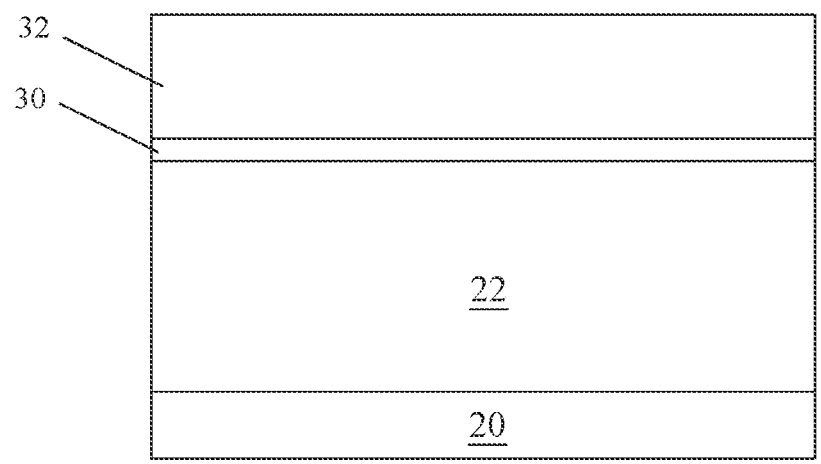
FIG. 3 shows a schematic structural diagram from FIG. 2 after a pad layer and an unoxidized material layer are sequentially formed on the epitaxial layer.

Next, after RCA cleaning, as shown in FIG. 3, a pad layer 30 and an unoxidized material layer 32 are sequentially provided on the epitaxial layer 22 (step S104). According to one embodiment of the present invention, silicon dioxide can be deposited so as to form the pad layer 30, and a polysilicon (Poly-Si) or an amorphous silicon carbide (SiC) can be deposited so as to form the unoxidized material layer 32. However, the present invention is certainly not limited to such embodiment. For references, the Applicants of the present invention further provide variant embodiments, including the pad layer 30 made of silicon nitride ($Si_3N_4$). Alternatively, the pad layer 30 may also include both the silicon dioxide and the silicon nitride. In other words, the pad layer 30 of the present invention may be a single-layer structure, which is made of silicon dioxide ($SiO_2$) or silicon nitride ($Si_3N_4$). Alternatively, the pad layer 30 of the present invention may also be a stacked-layer structure, which is consisting of silicon dioxide ($SiO_2$) and silicon nitride ($Si_3N_4$). These variant embodiments are practicable to implement the present invention. Among these embodiments, a thickness of the pad layer 30 can be for example, between 10 nm and 100 nm. And, a thickness of the unoxidized material layer 32 can be for example, between 0.5 μm and 3 μm. Furthermore, in addition to the above-mentioned polysilicon and amorphous silicon carbide, other material having a relatively rapid oxidation rate and its oxide can be easily removed, is also applicable to fabricating the unoxidized material layer 32 of the present invention.

Figure 4:
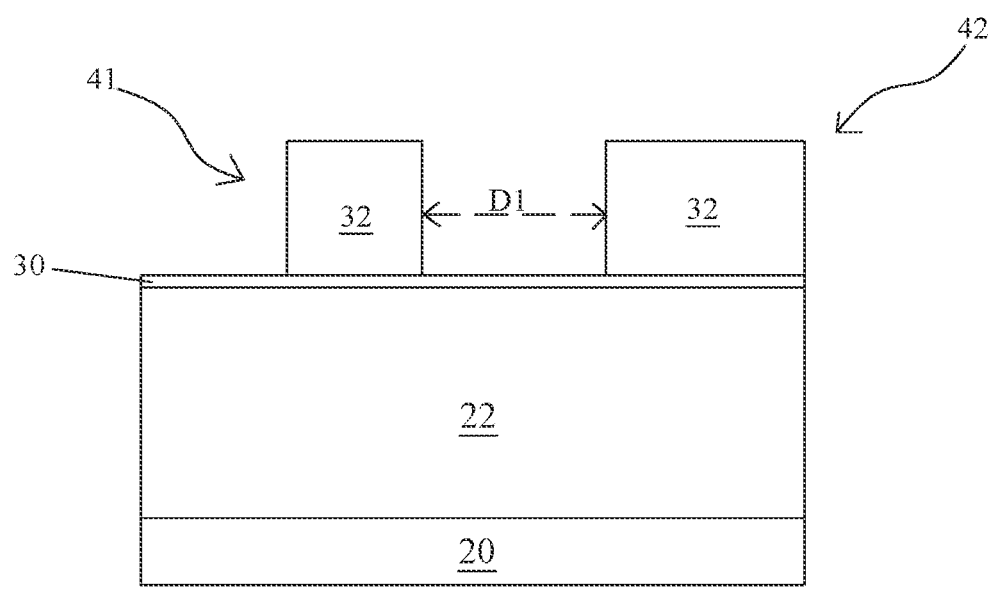
FIG. 4 shows a schematic structural diagram from FIG. 3 when a patterning step is performed to form a first barrier mask and a second barrier mask.

Later on, as shown in the step S106, the unoxidized material layer 32 is patterned to form at least one first barrier mask 41 and second barrier mask 42, as illustrated in FIG. 4. As we can see from FIG. 4, it is apparent that a first gap D1 is formed between the first barrier mask 41 and the second barrier mask 42 after the patterning step. According to one embodiment of the present invention, the patterning step disclosed in the step S106 can be performed, for instance through a lithography process, so as to make the unoxidized material layer 32 form into specific block shapes, which are the first barrier mask 41 and the second barrier mask 42 as to be formed in FIG. 4.

Figure 5:
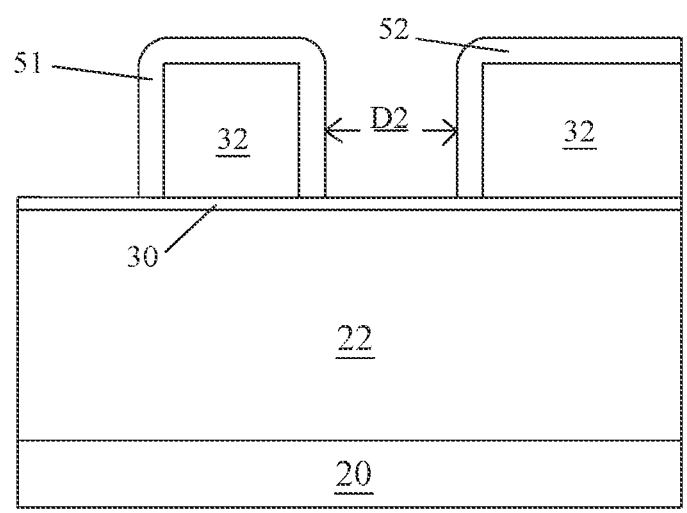
FIG. 5 shows a schematic structural diagram from FIG. 4 after a thermal oxidation process is performed.

And then, as shown in the step S108, a thermal oxidation process is performed such that the unoxidized material layer 32 is oxidized to form oxidation layers through the thermal oxidation process. According to the embodiment of the present invention, the unoxidized material layer 32 is oxidized to form a first oxidation layer 51 and a second oxidation layer 52 as illustrated in FIG. 5. According to the diagrams shown in FIG. 4 and FIG. 5, it is apparent that first barrier mask 41 is coated with the first oxidation layer 51 and the second barrier mask 42 is coated with the second oxidation layer 52. A second gap D2 is formed between the first oxidation layer 51 and the second oxidation layer 52, and such second gap D2 is less than the previously described first gap D1. As we can see from the technical characteristics of the present invention, the present invention is mainly aimed to adopt the thermal oxidation process to oxidize the unoxidized material layer 32, such that the unoxidized material layer 32 expands its boundary. And therefore, the gap between adjacent barrier masks after the unoxidized material layer 32 is patterned can be reduced.

According to one embodiment of the present invention, when regarding the foregoing thermal oxidation process to be performed, a process temperature of the thermal oxidation process can be set for example, between 800 and 1100 Celsius degrees. And a process time of the thermal oxidation process can be between 0.5 and 12 hours. A thickness of the first oxidation layer 51 and the second oxidation layer 52 to be formed is for example, between 0.2 μm and 1.0 μm. Preferably, the thickness is generally between 0.4 μm and 0.5 μm. Overall, for people who are skilled in the art with ordinary knowledge, it can be expected that appropriate adjustments and modifications can be made according to their actual requirements regarding the specific types, technical characteristics and channel length of the transistor to be applied, without departing from the technical spirits of the present invention. However, it is believed that within the scope of its equality, such modifications should still fall into the scope and claims of the present invention.

Figure 6:
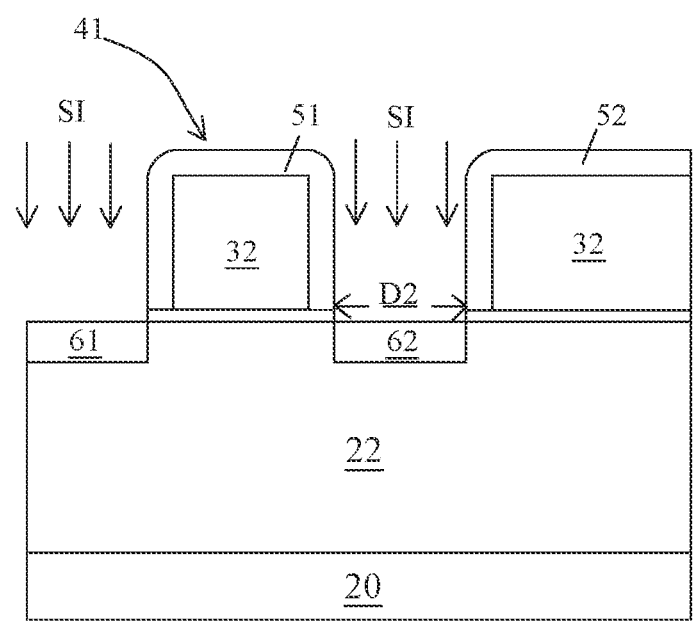
FIG. 6 shows a schematic structural diagram from FIG. 5 after a source ion implantation process is performed.

Subsequently, please refer to FIG. 6, in which a source ion implantation process SI is performed (step S110), such that a first heavily doped region 61 and a second heavily doped region 62 are formed in the foregoing epitaxial layer 22. Since a thickness of the pad layer 30 initially disposed on the upper surface of the first heavily doped region 61 and the second heavily doped region 62 is relatively thin, it basically does not affect how the source ion implantation process SI is performed and its implantation result. Therefore, the pad layer 30 can be selectively removed or retained in practice. The main concept of the present invention is to employ the source ion implantation process SI such that the first heavily doped region 61 and the second heavily doped region 62 can be respectively formed and configured on opposite sides of the first barrier mask 41. And, as shown in FIG. 6, it is obvious that the source region formed due to the source ion implantation process SI (i.e. the second heavily doped region 62) is now self-aligned with the above-mentioned second gap D2.

Figure 7:
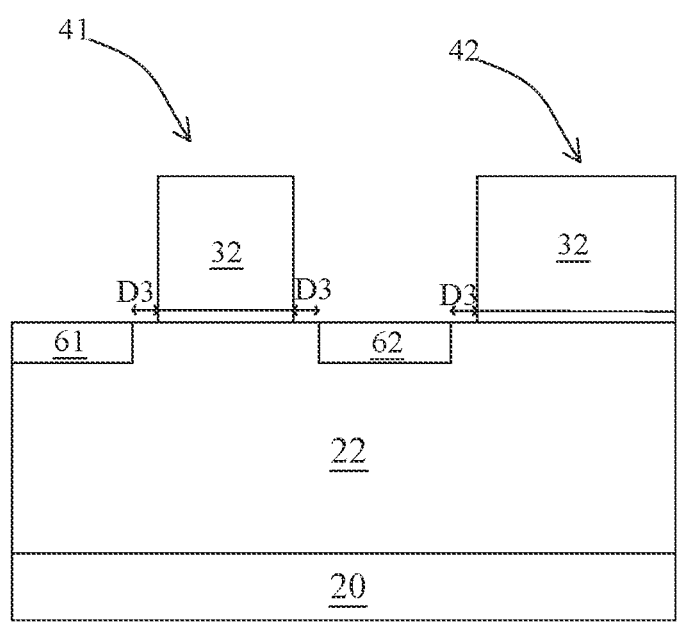
FIG. 7 shows a schematic structural diagram from FIG. 6 after a wet etching process is performed.

And then, please refer to FIG. 7, in which the first oxidation layer 51, the second oxidation layer 52, and the pad layer 30 under the first oxidation layer 51 and the second oxidation layer 52 can be removed (step S112), such that a plurality of implantation gap D3 is exposed between the first heavily doped region 61, the second heavily doped region 62, the first barrier mask 41 and the second barrier mask 42. It draws our attention that, in one embodiment of the present invention when the pad layer 30 is made of silicon dioxide, then the SiO$_2$ pad layer will be removed along with the first oxidation layer 51 and the second oxidation layer 52 in such step. However, in an alternative embodiment of the present invention when the pad layer 30 is made of silicon nitride, then the Si$_3$N$_4$ pad layer 30 can be optionally reserved and does not need to be removed deliberately. Regarding such removing step, according to one embodiment of the present invention, a wet etching process can be utilized to remove these structures (for example, silicon dioxide) including the first oxidation layer 51, the second oxidation layer 52, and the pad layer 30 under the first and second oxidation layers, so the unoxidized material layer 32 (for example, Poly-Si) is left.

Figure 8:
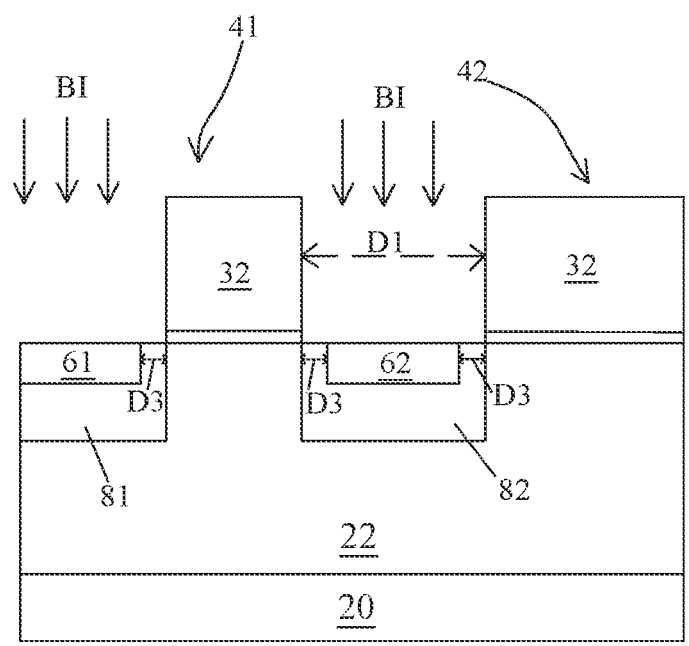
FIG. 8 shows a schematic structural diagram from FIG. 7 after a body ion implantation process is performed.

Next, please refer to FIG. 8, in which a body ion implantation process BI is successively performed, such that a first body region 81 and a second body region 82 are formed in the foregoing epitaxial layer 22 (step S114). As shown in FIG. 8, the first body region 81 and the second body region 82 fill the plurality of implantation gap D3. And, the above-mentioned first heavily doped region 61 and second heavily doped region 62 are respectively configured in the first body region 81 and the second body region 82. By employing the body ion implantation process BI of the present invention, it is apparent that the first body region 81 and the second body region 82 to be formed are thus respectively aligned with the first heavily doped region 61 and the second heavily doped region 62. To be more specific, according to the disclosed technical features of the present invention, the first body region 81 and the second body region 82 are aligned with a peripheral border of the first barrier mask 41 and the second barrier mask 42, which is self-aligned with the above-mentioned first gap D1.

As a result, to sum up, according to a preferred embodiment of the present invention, a Poly-Si is deposited first and a lithography process is then performed to pattern the Poly-Si into barrier masks. Next, a thermal oxidation process is employed to expand its boundary. After the expansion is complete, a source ion implantation process is performed to fabricate the source regions (the first heavily doped region 61 and the second heavily doped region 62 in the embodiment). Then, a wet etching process is used to remove silicon dioxide and retain the Poly-Si. After that, a body ion implantation process is performed to form the body regions (the first body region 81 and the second body region 82 in the embodiment). By utilizing these process steps, it is believed that the self-alignment of the source regions and the body regions are successfully achieved.

According to the technical concept of the present invention, it simply uses a wet etching process to remove silicon dioxide (the first oxidation layer 51 and the second oxidation layer 52 in the embodiment). As a result, not only the surface damage of the channel region is controlled and minimized effectively, improving its surface roughness, but also, the mobility of the channel carriers is improved accordingly, which increases the channel current and reduce the on-resistance at the same time.

Figure 9:
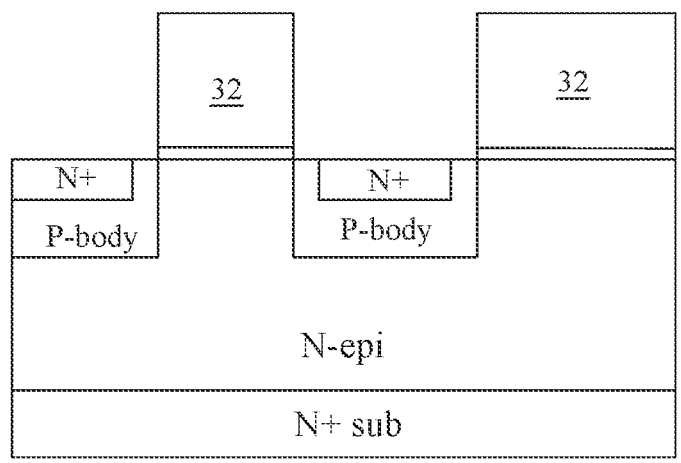
FIG. 9 shows a schematic structural diagram illustrating a self-alignment of an N-type source region and a P-type body region by employing the disclosed process method of the present invention.
Figure 10:
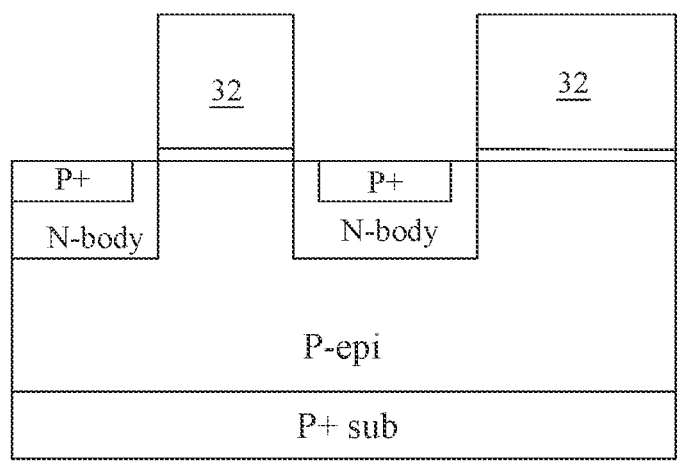
FIG. 10 shows a schematic structural diagram illustrating a self-alignment of a P-type source region and an N-type body region by employing the disclosed process method of the present invention.

Moreover, it is worth noting that the present invention is not limited to its semiconductor conductivity type. In general, the above-mentioned semiconductor substrate, the epitaxial layer, the first heavily doped region and the second heavily doped region have a first semiconductor type. And the first body region and the second body region have a second semiconductor type. The first semiconductor type and the second semiconductor type are opposite conductivity types. In one embodiment of the present invention, when the first semiconductor type is N-type, the second semiconductor type is P-type. While in another embodiment of the present invention, when the first semiconductor type is P-type, the second semiconductor type is N-type. That is to say, according to the disclosed technical solution of the present invention, it achieves in the self-alignment of an N-type source region (N+) and a P-type body region (P-body) as shown in FIG. 9. And based on the same principles, by employing the disclosed self-aligned method of the present invention, it also achieves in the self-alignment of a P-type source region (P+) and an N-type body region (N-body) as shown in FIG. 10.

In addition, when considering the source ion implantation process performed in the step S110 and the body ion implantation process performed in the step S114, their implanted ion species will also vary according to different semiconductor conductivity type. Those skilled in the art are allowed to decide based on practical requirements. Relevant descriptions are thus omitted in the present invention.

Figure 11:
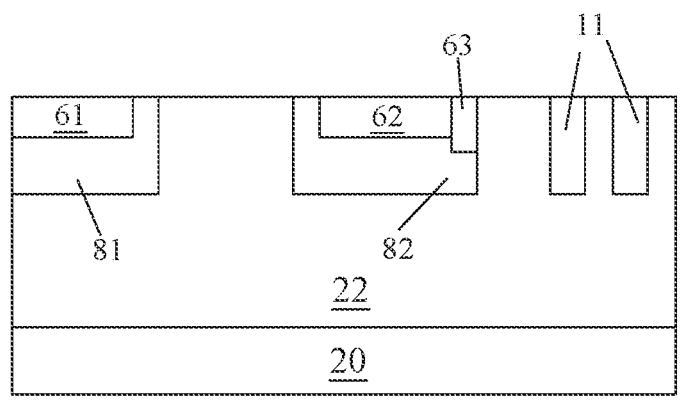
FIG. 11 shows a schematic structural diagram from FIG. 8 after definition and ion implantations of the third heavily doped region and floating guard ring regions are performed.
Figure 12:
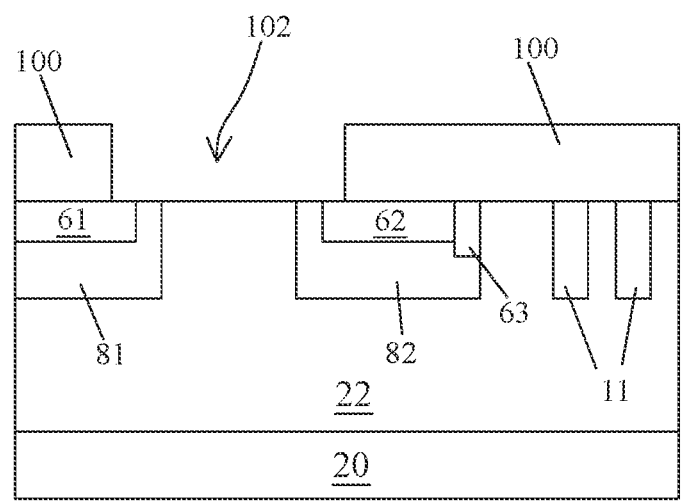
FIG. 12 shows a schematic structural diagram from FIG. 11 after a field oxide layer is grown.

Subsequently, after the source-body self-alignment is achieved, the present invention may proceed to remove the remaining pad layer 30 and the unoxidized material layer 32. Then, silicon dioxide is deposited as a hard mask, and a lithography process is employed to define patterns such that a third heavily doped region 63 is formed in the second body region 82, as shown in FIG. 11. Moreover, a floating guard ring implantation process can be alternatively performed to further fabricate at least one floating guard ring 11 in the epitaxial layer 22 as a termination protection structure. After that, as shown in FIG. 12, a chemical vapor deposition (CVD) process can be successively employed to deposit silicon dioxide as a field oxide layer 100 and a lithography process can be then applied to the field oxide layer 100 to define a gate region 102. After that, please refer to FIG. 13, in which a gate oxide layer 111 is formed in the gate region 102. According to the embodiment of the present invention, the gate oxide layer 111 can be formed by employing either a thermal oxidation process or a chemical vapor deposition process. Later, as shown in FIG. 14, a gate conductive layer 122 is then formed on the gate oxide layer 111. In one preferable embodiment of the present invention, a low-pressure chemical vapor deposition (LPCVD) process is usually firstly used to deposit polysilicon as a gate material in the current manufacturing process. After that, an etch back process is employed to etch back the polysilicon, so as to form the structure of the gate conductive layer 122 as shown in FIG. 14.

Figure 15:
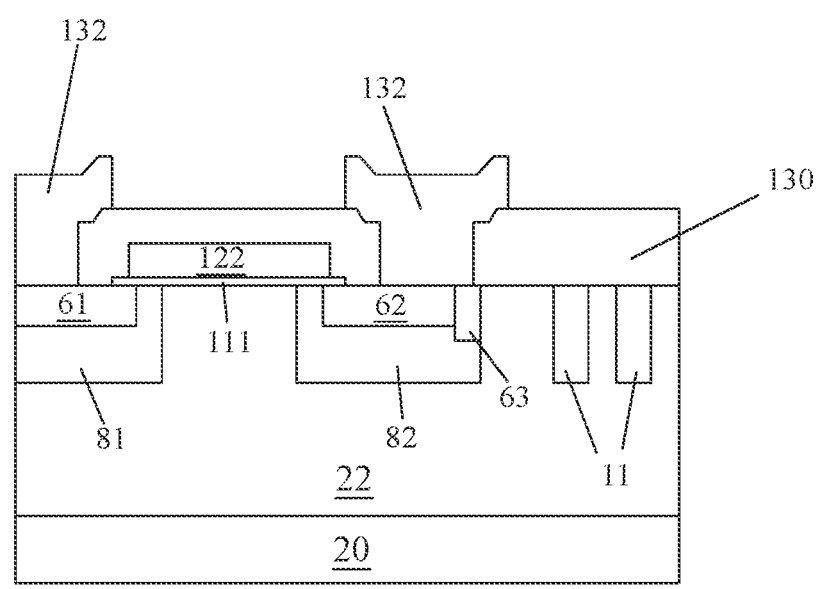
FIG. 15 shows a schematic structural diagram from FIG. 14, in which a dielectric layer is further deposited and at least one contact window is formed to complete the transistor fabrication.

And then, as shown in FIG. 15, a dielectric layer 130 is further deposited on the gate conductive layer 122. Finally, at least one contact window 132 is formed and followed by a plurality of process steps including contact window etching, metal deposition, metal etching, etc., wherein the contact windows 132 extend through the dielectric layer 130, and electrically connected to the first heavily doped region 61, the second heavily doped region 62 and the third heavily doped region 63 of the VDMOSFET for providing electrical paths. On the other hand, from another perspective view (not seen in this figure), the polysilicon gate will also need to have alleged metal contacts. Nevertheless, since the configurations are not seen from the cross section of this perspective view in such figure, and those skilled in the art should be able to implement based on various requirements, redundant descriptions are disregarded herein.

Figure 13:
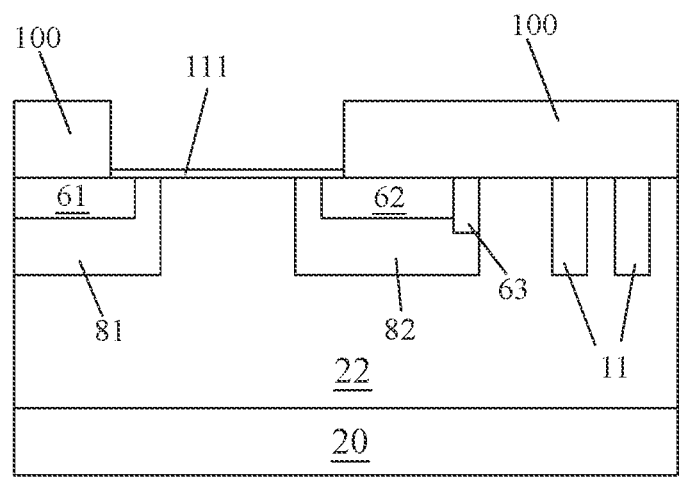
FIG. 13 shows a schematic structural diagram from FIG. 12, in which a gate oxide layer is formed.
Figure 14:
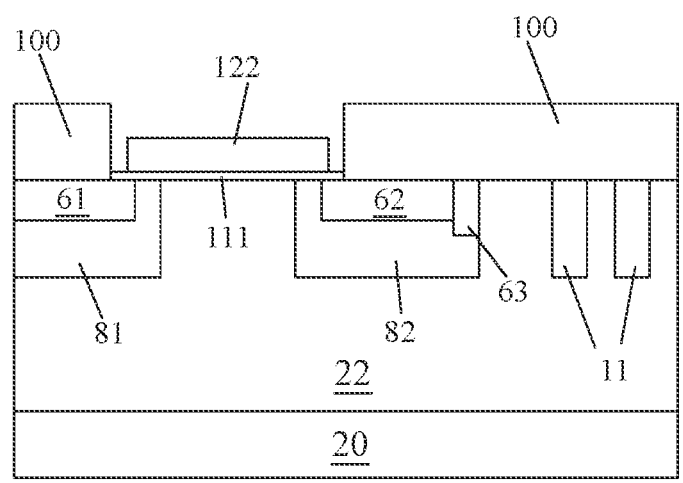
FIG. 14 shows a schematic structural diagram from FIG. 13, in which a gate conductive layer is further formed on the gate oxide layer.

General speaking, considering the post end process steps from FIG. 11 to FIG. 15 including: definition and ion implantations of the third heavily doped region and floating guard ring regions (as shown in FIG. 11), using a chemical vapor deposition process to deposit silicon dioxide for growing a field oxide layer (as shown in FIG. 12), using a thermal oxidation process or a chemical vapor deposition process to form the gate oxide layer (as shown in FIG. 13), performing gate deposition to form the gate conductive layer (as shown in FIG. 14), performing dielectric layer deposition, contact window etching, metal deposition, and metal etching (as shown in FIG. 15), since these steps are mostly the same as they are in a conventional VDMOSFET manufacturing process and the fabricated device is shown in FIG. 15, the present invention is thus not intended to go deeper into details regarding the post end process flows.

What is important lies in, the inventive spirits of the present invention focus on simply using a thermal oxidation process along with a wet etching process to remove silicon dioxide, such that the source-body self-alignment in the VDMOSFET structure can be effectively accomplished. In view of the innovative process technology disclosed by the present invention, it is characterized by extremely low process complexity. Apart from that, the channel length may also be effectively fixed and shortened, the on-resistance can be reduced, and the device reliability is accordingly improved significantly.

Furthermore, since the self-alignment of the source region and body region of the VDMOSFET structure is successfully achieved by the present invention without considering any misalignment, a channel length can be reduced to less than 0.5 µm and a cell pitch can be reduced by more than 1.0 µm, which in turn, increases its equivalent channel width and reduces on-resistance. Meanwhile, when compared with the existing technologies, since the present invention effectively shortens the channel length to less than 0.5 µm, the oxidation time of Poly-Si can be also reduced, and therefore consumes less amount of Poly-Si (only about 0.22 µm). As a result, it is believed that the present invention is advantageous of superior process uniformity and process cost, and can be inventive and widely brought into a variety of industrial applications.

As such, in view of the above-mentioned technical features, it is guaranteed that the present invention proposes an extremely novel and inventive process technique. Compared with the prior art, it is believed that the embodiments disclosed in the present invention and the process method thereof can effectively solve the existing deficiencies in the prior art. In addition, according to the process method disclosed in the present invention, it can be effectively applied to silicon carbide substrate, and further to any other substrate which is made of semiconductor materials having a wide bandgap. Apart from these, according to the source-body self-aligned method disclosed in the present invention, it is obvious that the process method can be applied to a general Vertical Double Diffused Metal Oxide Semiconductor Field Effect Transistor (VDMOSFET). Alternatively, it can be further widely applied to any power transistor which includes the VDMOSFET structure, for example, an Insulated Gate Bipolar Transistor (IGBT). As a result, in view of all, the present invention is characterized by having superior process flexibility and is certainly not limited to the parameters and/or conditions disclosed herein. The Applicants assert that the present invention is instinct, effective and highly competitive for incoming technologies, industries and researches developed in the future. And since the technical features, means and effects achieved by the present invention are significantly different from the current solutions and can not be accomplished easily by those who are familiar with the industry, it is thus believed that the present invention is indeed characterized by patentability and shall be patentable soon in a near future.

It is worth reminding that the present invention is not limited to the above-mentioned process layouts. In other words, those skilled in the art are able to make equivalent modifications and variations based on their actual product specifications. And yet, it is believed that such modified embodiments should still fall within the scope of the present invention.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A source-body self-aligned method of a vertical double diffused metal oxide semiconductor field effect transistor (VDMOSFET), comprising:
   providing a semiconductor substrate and forming an epitaxial layer on the semiconductor substrate;
   sequentially providing a pad layer and an unoxidized material layer on the epitaxial layer;
   patterning the unoxidized material layer to form at least one first barrier mask and a second barrier mask, such that a first gap is formed between the first barrier mask and the second barrier mask;
   performing a thermal oxidation process such that the unoxidized material layer is oxidized to form a first oxidation layer and a second oxidation layer, wherein the first barrier mask is coated with the first oxidation layer, the second barrier mask is coated with the second oxidation layer, a second gap is formed between the first oxidation layer and the second oxidation layer, and the second gap is less than the first gap;
   performing a source ion implantation process, such that a first heavily doped region and a second heavily doped region are formed in the epitaxial layer, wherein the first heavily doped region and the second heavily doped region are respectively configured on opposite sides of the first barrier mask, and either the first heavily doped region or the second heavily doped region is self-aligned with the second gap;

removing the first oxidation layer and the second oxidation layer, such that a plurality of implantation gap is exposed between the first heavily doped region, the second heavily doped region, the first barrier mask and the second barrier mask; and performing a body ion implantation process, such that a first body region and a second body region are formed in the epitaxial layer, and the first body region and the second body region fill the plurality of implantation gap, wherein the first heavily doped region and the second heavily doped region are respectively configured in the first body region and the second body region, and the first body region and the second body region are respectively self-aligned with the first heavily doped region and the second heavily doped region.

2. The source-body self-aligned method according to claim 1, wherein the first body region and the second body region are aligned with a peripheral border of the first barrier mask and the second barrier mask.

3. The source-body self-aligned method according to claim 1, wherein either the first body region or the second body region is aligned with the first gap.

4. The source-body self-aligned method according to claim 1, wherein the pad layer is a single-layer structure made of silicon dioxide or silicon nitride, or the pad layer is a stacked-layer structure, consisting of silicon dioxide and silicon nitride.

5. The source-body self-aligned method according to claim 1, wherein a thickness of the pad layer is between 10 nm and 100 nm.

6. The source-body self-aligned method according to claim 1, wherein the unoxidized material layer is made of polysilicon or amorphous silicon carbide.

7. The source-body self-aligned method according to claim 1, wherein a thickness of the unoxidized material layer is between 0.5 µm and 3 µm.

8. The source-body self-aligned method according to claim 1, wherein a process temperature of the thermal oxidation process is between 800 and 1100 Celsius degrees.

9. The source-body self-aligned method according to claim 1, wherein a process time of the thermal oxidation process is between 0.5 and 12 hours.

10. The source-body self-aligned method according to claim 1, wherein a thickness of the first oxidation layer and the second oxidation layer is between 0.2 µm and 1.0 µm.

11. The source-body self-aligned method according to claim 1, wherein the semiconductor substrate, the epitaxial layer, the first heavily doped region and the second heavily doped region have a first semiconductor type, the first body region and the second body region have a second semiconductor type, and the first semiconductor type and the second semiconductor type are opposite conductivity types.

12. The source-body self-aligned method according to claim 1, after the first body region and the second body region are formed, further comprising:

removing the pad layer and the unoxidized material layer, and forming a third heavily doped region in the first body region or in the second body region;

growing a field oxide layer on the epitaxial layer;

applying a lithography process to the field oxide layer to define a gate region;

forming a gate oxide layer in the gate region;

forming a gate conductive layer on the gate oxide layer and further depositing a dielectric layer on the gate conductive layer; and forming at least one contact window which extends through the dielectric layer, and electrically connected to the first heavily doped region, the second heavily doped region and the third heavily doped region for providing electrical paths.

13. The source-body self-aligned method according to claim 12, wherein in the step of forming the gate conductive layer, further comprising:

using a low-pressure chemical vapor deposition (LPCVD) process to deposit a polysilicon; and using an etch back process to etch back the polysilicon, so as to form the gate conductive layer.

14. The source-body self-aligned method according to claim 12, after the third heavily doped region is formed, further comprising performing a floating guard ring implantation process so as to fabricate at least one floating guard ring in the epitaxial layer.

15. The source-body self-aligned method according to claim 1, wherein the semiconductor substrate is made of silicon carbide (SiC), gallium oxide ($Ga_2O_3$), aluminum nitride (AlN), or diamond.

16. The source-body self-aligned method according to claim 1, wherein the first oxidation layer and the second oxidation layer are removed by using a wet etching process.

* * * * *